US009812474B2

(12) United States Patent
Yagi et al.

(10) Patent No.: US 9,812,474 B2
(45) Date of Patent: Nov. 7, 2017

(54) IMAGING APPARATUS AND IMAGING SYSTEM (71) Applicant: CANON KABUSHIKI KAISHA, Tokyo (JP)

(72) Inventors: Tomoyuki Yagi, Honjo (JP); Toshio Kameshima, Kumagaya (JP); Katsuro Takenaka, Honjo (JP); Sho Sato, Tokyo (JP); Hideyuki Okada, Honjo (JP); Atsushi Iwashita, Saitama (JP); Eriko Sato, Tokyo (JP); Takuya Ryu, Kokubunji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 424 days.

(21) Appl. No.: 14/665,045

(22) Filed: Mar. 23, 2015

(65) Prior Publication Data
US 2015/0279882 A1 Oct. 1, 2015

(30) Foreign Application Priority Data

Mar. 31, 2014 (JP) .................................. 2014-073725

(51) Int. Cl.
*H01L 27/146* (2006.01)
*H04N 5/3745* (2011.01)
(Continued)

(52) U.S. Cl.
CPC .......... *H01L 27/14609* (2013.01); *G01T 1/17* (2013.01); *H04N 5/32* (2013.01);
(Continued)

(58) Field of Classification Search
CPC .............. H01L 27/14609; H04N 5/341; H04N 5/3651; H04N 5/3765; H04N 5/3745
(Continued)

(56) References Cited

U.S. PATENT DOCUMENTS

| 6,111,606 A | 8/2000 | Ikeda ............................ 348/241 |
| 6,952,015 B2 | 10/2005 | Kameshima |

(Continued)

FOREIGN PATENT DOCUMENTS

| CN | 1716773 | 1/2006 |
| CN | 101540200 | 9/2009 |

(Continued)

OTHER PUBLICATIONS

Office Action dated Aug. 29, 2017 in Chinese counterpart application 201510134946.1, with translation.

*Primary Examiner* — Seung C Sohn
(74) *Attorney, Agent, or Firm* — Fitzpatrick, Cella, Harper & Scinto (57) ABSTRACT

An imaging apparatus includes a pixel that generates charge; an integral amplifier that integrates charge transferred from the pixel; a low pass filter to which output of the integral amplifier is supplied and whose time constant is variable; first and second sample-and-hold circuits that sample and hold output of the low pass filter before and after the charge is transferred from the pixel to the integral amplifier, respectively; a differential circuit that outputs a difference between signals held by the first and second sample-and-hold circuits; and a control circuit that changes the time constant. The control circuit decreases the time constant after the sampling by the first sample-and-hold circuit ends, and increases the time constant in the middle of the sampling by the second sample-and-hold circuit.

14 Claims, 9 Drawing Sheets

(51) Int. Cl.

| | | |
|---|---|---|
| *H04N 5/341* | (2011.01) | |
| *H04N 5/365* | (2011.01) | |
| *H04N 5/376* | (2011.01) | |
| *G01T 1/17* | (2006.01) | |
| *H04N 5/32* | (2006.01) | |
| *H04N 5/357* | (2011.01) | |
| *H04N 5/363* | (2011.01) | |
| *H04N 5/378* | (2011.01) | |

(52) U.S. Cl.
CPC ........... *H04N 5/341* (2013.01); *H04N 5/3575* (2013.01); *H04N 5/363* (2013.01); *H04N 5/3651* (2013.01); *H04N 5/3658* (2013.01); *H04N 5/378* (2013.01); *H04N 5/3745* (2013.01); *H04N 5/3765* (2013.01)

(58) Field of Classification Search
USPC ...................................................... 250/208.1
See application file for complete search history.

(56) References Cited

U.S. PATENT DOCUMENTS

| | | |
|---|---|---|
| 7,002,157 B2 | 2/2006 | Kameshima |
| 7,135,681 B2 | 11/2006 | Yamaguchi |
| 7,138,639 B2 | 11/2006 | Kameshima |
| 7,466,345 B2 | 12/2008 | Kameshima et al. |
| 7,564,038 B2 | 7/2009 | Endo et al. |
| 7,705,911 B2 | 4/2010 | Kameshima |
| 7,786,448 B2 | 8/2010 | Endo et al. |
| 7,839,977 B2 | 11/2010 | Kameshima et al. |
| 7,948,539 B2 | 5/2011 | Yamaguchi |
| 7,965,817 B2 | 6/2011 | Kameshima et al. |
| 7,986,170 B2 | 7/2011 | Haraguchi ...................... 327/94 |
| 8,218,070 B2 | 7/2012 | Kameshima |
| 8,576,294 B2 | 11/2013 | Kameshima et al. |
| 8,809,795 B2 | 8/2014 | Takenaka et al. |
| 9,374,545 B2 * | 6/2016 | Fowler ...................... H03F 3/16 |
| 2005/0098725 A1 | 5/2005 | Yamaguchi ................. 250/336.1 |
| 2006/0001750 A1 | 1/2006 | Mizuguchi et al. .......... 348/294 |
| 2006/0139198 A1* | 6/2006 | Rao ...................... H03M 1/1028 |
| | | 341/155 |
| 2009/0201373 A1 | 8/2009 | Yamaguchi .................... 348/180 |

FOREIGN PATENT DOCUMENTS

| | | |
|---|---|---|
| JP | B 4448042 | 4/2010 |
| JP | B 4619640 | 1/2011 |

* cited by examiner

IMAGING APPARATUS AND IMAGING SYSTEM

BACKGROUND OF THE INVENTION

Field of the Invention

The present invention relates to an imaging apparatus and an imaging system.

Description of the Related Art

Japanese Patent No. 4619640 proposes a radiation imaging apparatus which is irradiated with radiation, such as X-rays, that has been transmitted through an object, and generates an image signal related to the object. The charge generated at pixels of this radiation imaging apparatus is transferred to an integral amplifier and is integrated. The radiation imaging apparatus performs correlated double sampling (CDS) on the output of the integral amplifier by using two sample-and-hold circuits in order to remove low-frequency noise from the output of the integral amplifier. Furthermore, the radiation imaging apparatus has a low pass filter between the integral amplifier and the sample-and-hold circuits in order to remove high-frequency noise from the output of the integral amplifier. Japanese Patent No. 4448042 also proposes a radiation imaging apparatus having a similar configuration.

SUMMARY OF THE INVENTION

In the radiation imaging apparatuses in Japanese Patent No. 4619640 and Japanese Patent No. 4448042, the time constant of the low pass filter is temporarily decreased such that the response in the output of the integral amplifier stabilizes soon. However, in these radiation imaging apparatuses, the time constant of the low pass filter is decreased only during an operation of resetting the integral amplifier, and accordingly the overall operation of reading out a pixel signal cannot be sufficiently shortened. An aspect of the present invention provides a technique that is advantageous to the shortening of readout of a pixel signal in an imaging apparatus.

According to some embodiments, an imaging apparatus is provided. The imaging apparatus includes a pixel that generates charge; an integral amplifier that integrates charge transferred from the pixel; a low pass filter to which output of the integral amplifier is supplied and whose time constant is variable; a first sample-and-hold circuit that samples and holds output of the low pass filter before the charge is transferred from the pixel to the integral amplifier; a second sample-and-hold circuit that samples and holds output of the low pass filter after the charge is transferred from the pixel to the integral amplifier; a differential circuit that outputs a difference between a signal held by the first sample-and-hold circuit and a signal held by the second sample-and-hold circuit; and a control circuit that changes the time constant of the low pass filter. The control circuit decreases the time constant of the low pass filter after the sampling by the first sample-and-hold circuit ends, and increases the time constant of the low pass filter in the middle of the sampling by the second sample-and-hold circuit.

Further features of the present invention will become apparent from the following description of exemplary embodiments with reference to the attached drawings.

DESCRIPTION OF THE EMBODIMENTS

Embodiments of the present invention will be hereinafter described with reference to the attached drawings. Throughout various embodiments, similar elements will be given identical reference numerals, and redundant descriptions will be omitted. The Embodiments can be changed or combined as appropriate. The present invention is, in general, applicable to an imaging apparatus that generates an image corresponding to incident electromagnetic waves having a specific wavelength range. A radiation imaging apparatus that generates an image corresponding to radiation, which includes X-rays and the like, will be described below as an exemplary imaging apparatus.

Figure 1:
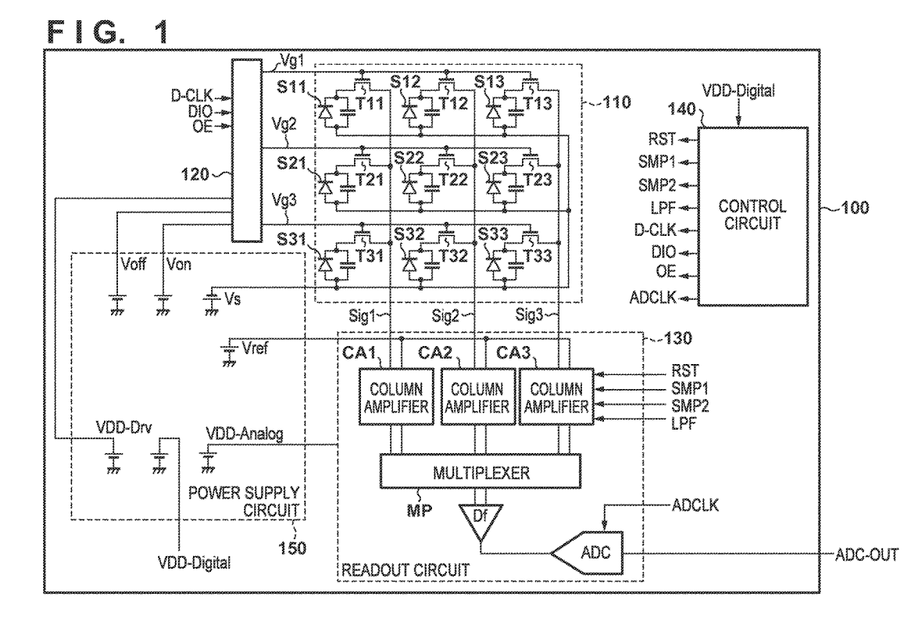
FIG. 1 is a block diagram illustrating an exemplary configuration of a radiation imaging apparatus according to some embodiments.

A configuration of a radiation imaging apparatus 100 according to some embodiments will be described with reference to the block diagram in FIG. 1. The radiation imaging apparatus 100 comprises a pixel array 110, a driving circuit 120, a readout circuit 130, a control circuit 140, and a power supply circuit 150, for example. The control circuit 140 supplies various control signals to the driving circuit 120 and the readout circuit 130 and controls operations thereof. The power supply circuit 150 supplies voltage that is to be used for operations of the pixel array 110, the driving circuit 120, the readout circuit 130, and the control circuit 140.

The pixel array 110 includes a plurality of conversion elements S11 to S33 and a plurality of thin-film transistors T11 to T33. A pair of one conversion element and one thin-film transistor constitutes one pixel, and a plurality of pixels are arranged in a two-dimensional array in the pixel array 110. The pixel array 110 is also called an area sensor in some cases. Although the pixel array 110 has 3×3 pixels in the example in FIG. 1, the arrangement of the pixels is not limited thereto.

The conversion elements S11 to S33 convert incident electromagnetic waves having a specific wavelength range into charge, and store this charge. The electromagnetic waves to be converted by the conversion elements S11 to S33 may be radiation that has entered the radiation imaging apparatus 100, or may be visible light obtained as a result of radiation that has entered the radiation imaging apparatus 100 being converted by a scintillator (not shown). The conversion elements S11 to S33 may be PIN-type conversion elements, or may be MIS-type conversion elements. Bias voltage is supplied from the power supply circuit 150 to one end of the conversion elements S11 to S33, and the other end of the conversion elements S11 to S33 is connected to signal lines Sig1 to Sig3 through the thin-film transistors T11 to T33.

A control signal is supplied to gates of the thin-film transistors T11 to T33 from the driving circuit 120 through driving lines Vg1 to Vg3. The thin-film transistors T11 to T33 are switched between an on state and an off state in accordance with a control signal supplied from the driving circuit 120. When the thin-film transistors T11 to T33 are in an on state, the charge stored in the conversion elements S11 to S33 are transferred to the signal lines Sig1 to Sig3. When the thin-film transistors T11 to T33 are in an off state, the charge remains stored in the conversion elements S11 to S33. That is to say, the thin-film transistors T11 to T33 operate as transfer transistors, or in more general, as transfer switches.

The charge transferred from the conversion elements S11 to S33 to the signal lines Sig1 to Sig3 is transferred to the readout circuit 130. Specifically, the charge transferred from the conversion elements S11 to S33 is transferred to column amplifiers CA1 to CA3 in the readout circuit 130. The column amplifiers CA1 to CA3 convert the charge into voltage, and supply it to a multiplexer MP. The multiplexer MP supplies signals supplied from the column amplifiers CA1 to CA3 to a differential circuit Df in order. The differential circuit Df obtains a difference between the two signals supplied from the multiplexer MP, and supplies it to an AD convertor ADC. The AD convertor ADC converts a supplied analog signal into a digital signal and outputs it.

Figure 2:
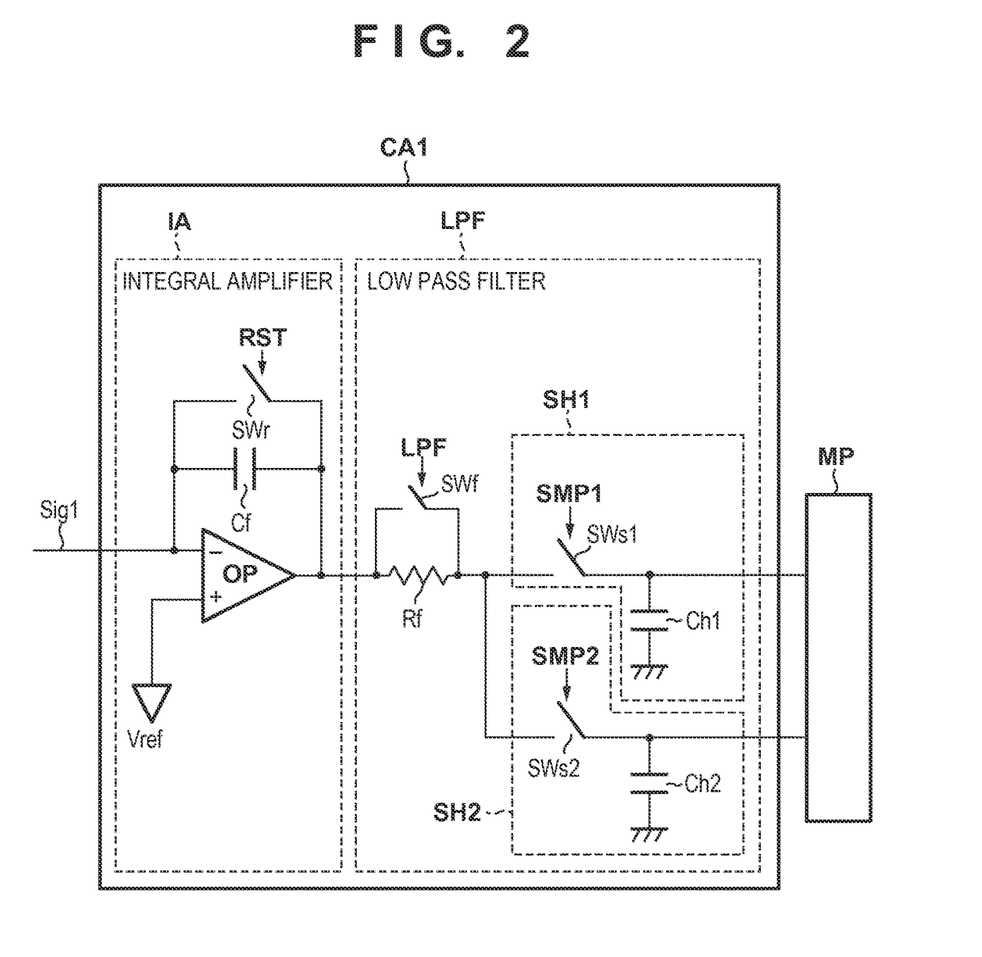
FIG. 2 is an equivalent circuit diagram illustrating an exemplary configuration of a column amplifier in the radiation imaging apparatus in FIG. 1.

Subsequently, a configuration of the column amplifier CA1 in FIG. 1 will be described with reference to the equivalent circuit diagram in FIG. 2. Although the column amplifier CA1 is illustrated in FIG. 2, the column amplifiers CA2 and CA3 also have a similar configuration. The column amplifier CA1 has an integral amplifier IA, a low pass filter LPF, a first sample-and-hold circuit SH1, and a second sample-and-hold circuit SH2.

The integral amplifier IA has an operational amplifier OP, a capacitor Cf, and a switch SWr, for example. The input to the column amplifier CA1, i.e., a charge signal transferred from each pixel is supplied to a first input terminal of the operational amplifier OP. Reference voltage Vref is supplied to a second input terminal of the operational amplifier OP. An output terminal of the operational amplifier OP is connected to the low pass filter LPF.

The integral amplifier IA stores the charge transferred from the pixels in the capacitor Cf, converts the stored charge into voltage, and outputs it. The gain of the integral amplifier IA is determined by a capacitance value of the capacitor Cf. An on state and an off state of the switch SWr are controlled by a control signal RST supplied from the control circuit 140. When the switch SWr is in an on state, both ends of the capacitor Cf are shorted, the voltage at both ends becomes equal to the reference voltage Vref, and the charge stored in the capacitor Cf is reset. The resetting of the charge stored in the capacitor Cf will be referred to as resetting of the integral amplifier IA. When the switch SWr is in an off state, the charge is stored in the capacitor Cf in accordance with the charge transferred from the pixels.

In the example in FIG. 2, the integral amplifier IA includes one capacitor Cf. However, the integral amplifier IA may be configured to include a plurality of capacitors so as to be able to select a capacitor that is to be connected to the operational amplifier OP. This configuration enables an appropriate gain to be set for each imaging technique in the case of using the radiation imaging apparatus 100 with a plurality of imaging techniques with different imaging conditions.

The low pass filter LPF has a resistor Rf, three switches SWf, SWs1, and SWs2, and two capacitors Ch1 and Ch2. The output of the integral amplifier IA is supplied to the low pass filter LPF. High-frequency components are removed from the output of the integral amplifier IA by the low pass filter LPF. The capacitance value of the capacitor Ch1 and the capacitance value of the capacitor Ch2 may be equal to each other.

An on state and an off state of the switch SWs1 are controlled by a control signal SMP1 supplied from the control circuit 140. When the switch SWs1 is in an on state, the resistor Rf and the capacitor Ch1 are connected to each other, and the resistance Rf and the capacitor Ch1 constitute the low pass filter. When the switch SWs1 is in an off state, the output of this low pass filter is held in the capacitor Ch1. That is to say, the switch SWs1 and the capacitor Ch1 constitute the first sample-and-hold circuit SH1.

An on state and an off state of the switch SWs2 are controlled by a control signal SMP2 supplied from the control circuit 140. When the switch SWs2 is in an on state, the resistor Rf and the capacitor Ch2 are connected to each other, and the resistance Rf and the capacitor Ch2 constitute the low pass filter. When the switch SWs2 is in an off state, the output of this low pass filter is held in the capacitor Ch2. That is to say, the switch SWs2 and the capacitor Ch2 constitute the second sample-and-hold circuit SH2.

An on state and an off state of the switch SWf are controlled by a control signal LPF supplied from the control circuit 140. When the switch SWf is in an on state, both ends of the resistor Rf are shorted. When the switch SWf is in an off state, both ends of the resistor Rf are not shorted. The time constant of the low pass filter LPF is changed by switching between an on state and an off state of the switch SWf.

For example, a case will be examined where the switch SWs1 is in an off state, the switch SWs2 is in an on state, and the resistor Rf and the capacitor Ch2 constitute the low pass filter. In the following description, the resistance value of the resistor Rf is rf, the capacitance value of the capacitor Ch2 is ch2, and the resistance value of the switch SWf when the switch SWf is in an on state is ron.

In this case, the time constant $\tau 1$ of the low pass filter LPF when the switch SWf is in an on state is given by the following equation.

$$\tau 1 = \{ron \times rf/(ron+rf)\} \times ch2$$

Assuming ron<<rf, $\tau 1$ is approximated by the following equation.

$$\tau 1 \approx ron \times ch2$$

On the other hand, the time constant $\tau 2$ of the low pass filter LPF when the switch SWf is in an off state is given by the following equation.

$$\tau 2 = rf \times ch2$$

For example, when rf=50 k$\Omega$ and ron=5$\Omega$, $\tau 2/\tau 1 \approx 10000$. Thus, the time constant of the low pass filter LPF is variable.

Here, $\tau 1$ is the time constant of the low pass filter before the sampling by the second sample-and-hold circuit SH2 is started, and $\tau 2$ is the time constant of the low pass filter immediately after the second sample-and-hold circuit SH2 starts the sampling. Although one low pass filter LPF is constituted by the two sample-and-hold circuits SH1 and SH2 in the example in FIG. 2, separate resistors may be connected to the respective sample-and-hold circuits and separate low pass filters may be constituted. Furthermore, although the sample-and-hold circuits SH1 and SH2 constitute a part of the low pass filter LPF in the example in FIG. 2, the low pass filter LPF and the sample-and-hold circuits SH1 and SH2 may be constituted by separate circuit elements.

Figure 3:
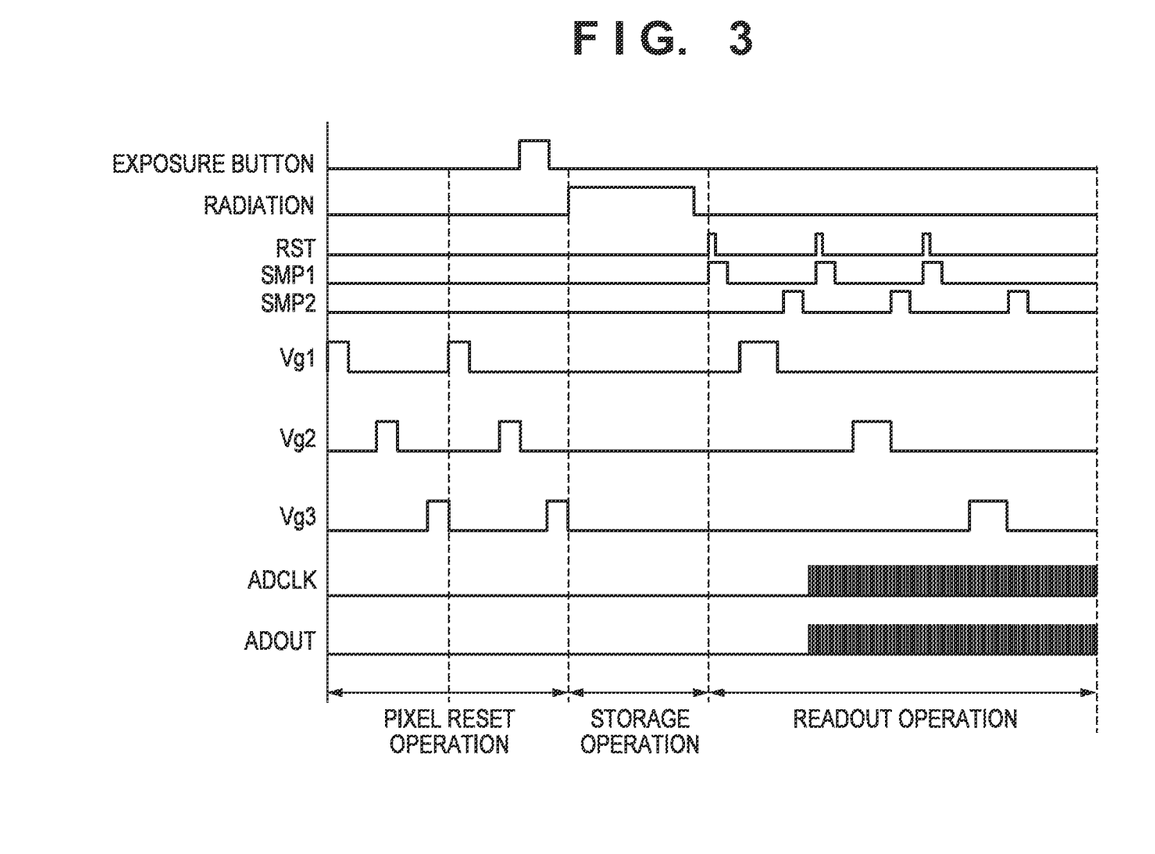
FIG. 3 is a timing chart illustrating an exemplary operation of the radiation imaging apparatus in FIG. 1.

Subsequently, an operation of the radiation imaging apparatus 100 will be described with reference to the timing chart in FIG. 3. In FIG. 3, an "exposure button" denotes a timing at which an instruction to expose the radiation imaging apparatus 100 to radiation is given. "Radiation" denotes the presence of radiation with which the radiation imaging apparatus 100 is irradiated. RST, SMP1, and SMP2 denote control signals supplied from the control circuit 140 to the switches SWr, SWs1, and SWs2, respectively. Vg1 to Vg3 denote control signals flowing through the driving lines Vg1 to Vg3, respectively. ADCLK denotes a clock supplied to the AD convertor ADC. ADOUT denotes the output from the AD convertor ADC.

The control circuit 140, in a state of waiting for radiation exposure, sequentially switches the control signals supplied to the driving lines Vg1 to Vg3 to a high level and sequentially turns on the thin-film transistors T11 to T33 ("pixel reset operation" in FIG. 3). As a result of this pixel reset operation, the charge generated due to dark current that is generated within the conversion elements S11 to S33 is discharged, and the pixels are reset.

Upon the radiation exposure button being pressed, the control circuit 140 maintains the control signals supplied to the driving lines Vg1 to Vg3 at a low level ("storage operation" in FIG. 3). The thin-film transistors T11 to T33 thereby remain in an off state, and the charge corresponding to the radiation that has been transmitted through the object is stored in the conversion elements S11 to S33.

Upon the radiation exposure ending, the control circuit 140 reads out the charge stored in the conversion elements S11 to S33 ("readout operation" in FIG. 3). Initially, the control circuit 140 switches the control signal RST to a high level and turns on the switch SWr. Thus, the integral amplifier IA is reset. After the integral amplifier IA is reset, the control circuit 140 switches the control signal SMP1 to a high level and turns on the switch SWs1. The resistor Rf and the capacitor Ch1 thereby constitute the low pass filter, and the first sample-and-hold circuit SH1 starts the sampling of the output of the integral amplifier IA through this low pass filter. Thereafter, the control circuit 140 switches the control signal SMP1 to a low level and turns off the switch SWs1. The first sample-and-hold circuit SH1 thereby ends the sampling, and the output of the low pass filter LPF at this time point is held in the capacitor Ch1.

Subsequently, the control circuit 140 switches the control signal supplied to the driving line Vg1 to a high level and turns on the thin-film transistors T11 to T13. The charge stored in the conversion elements S11 to S13 is thereby transferred to the column amplifiers CA1 to CA3 and is held in the respective integral amplifiers IA.

Subsequently, the control circuit 140 switches the control signal SMP2 to a high level and turns on the switch SWs2. The resistor Rf and the capacitor Ch2 thereby constitute the low pass filter, and the second sample-and-hold circuit SH2 starts the sampling of the output of the integral amplifier IA through this low pass filter. Thereafter, the control circuit 140 switches the control signal SMP2 to a low level and turns off the switch SWs2. The second sample-and-hold circuit SH2 thereby ends the sampling, and the output of the low pass filter LPF at this time point is held in the capacitor Ch2.

At this time point, the capacitor Ch1 holds the output of the integral amplifier IA before the charge of the pixel is transferred, and the capacitor Ch2 holds the output of the integral amplifier IA after the charge of the pixel is transferred. Thereafter, the differential circuit Df calculates the difference between these outputs, and supplies it as a pixel signal to the AD convertor ADC. That is to say, correlated double sampling (CDS) is performed by the differential circuit Df. As a result of the correlated double sampling, low-frequency noise is removed from the output of the integral amplifier IA. High-frequency noise is also removed from the output of the integral amplifier IA by the aforementioned low pass filter LPF. Thereafter, similar processing is also performed for the driving lines Vg2 and Vg3.

Figure 4:
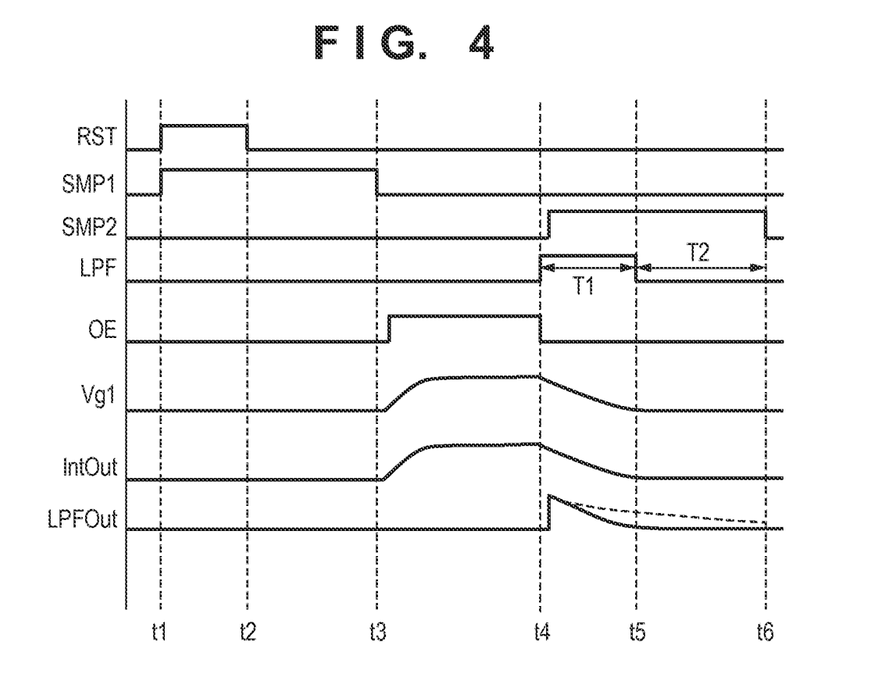
FIG. 4 is a timing chart illustrating a part of the operation in FIG. 3 in detail.

Subsequently, a part of the readout operation in the timing chart in FIG. 3 will be described in detail with reference to the timing chart in FIG. 4. In FIG. 4, LPF denotes a control signal supplied from the control circuit 140 to the switch SWf. OE denotes a control signal supplied from the control circuit 140 to the driving circuit 120. The driving circuit 120 sets the control signal supplied to the driving line Vg1 at a high level when the control signal OE is at a high level, and sets the control signal supplied to the driving line Vg1 at a low level when the control signal OE is at a low level. That is to say, the time period during which the control signal OE is at a high level is a charge transfer period. LPFOut denotes a response observed in the output of the low pass filter LPF. Other symbols are the same as those in FIG. 3.

After the sampling by the first sample-and-hold circuit SH1 ends at the time t3, the control circuit 140 switches the control signal LPF supplied to the switch SWf to a high level and decreases the time constant of the low pass filter LPF. Thereafter, the control circuit 140 switches the control signal LPF supplied to the switch SWf to a low level and increases the time constant of the low pass filter LPF at the time t5 in the middle of the sampling by the second sample-and-hold circuit SH2. In the example in FIG. 4, the control circuit 140 decreases the time constant of the low pass filter LPF simultaneously with switching the control signal OE to a low level at the time t4, i.e., simultaneously with the end of the time period during which the charge is transferred from the pixel. Thus, the time taken until the response in the output of the low pass filter LPF is completed is shortened by decreasing the time constant of the low pass filter LPF during the sampling by the second sample-and-hold circuit SH2. The time taken for the sampling by the second sample-and-hold circuit SH2 can be shortened accordingly.

The decreasing of the time constant of the low pass filter LPF may be continued until the response of the integral amplifier IA is completed. For example, after the charge transfer period ends and the thin-film transistors T11 to T33 are turned off, if the time constant of the low pass filter LPF is increased before the response of the integral amplifier IA is completed, the response in the output of the low pass filter LPF is as shown by the broken line in FIG. 4. The response indicated by the broken line takes longer time until the response converges than that of the response indicated by the solid line, and the time taken for the sampling also becomes longer accordingly.

Assume that, as shown in FIG. 4, the time period from when the charge transfer period ends until the time constant of the low pass filter LPF is increased (i.e., t5-t4) is T1. The response of the integral amplifier IA after the charge transfer period ends is affected by the control signals flowing through the driving lines Vg1 to Vg3. For this reason, the time period T1 may be determined while considering the control signals flowing through the driving lines Vg1 to Vg3.

Figure 5:
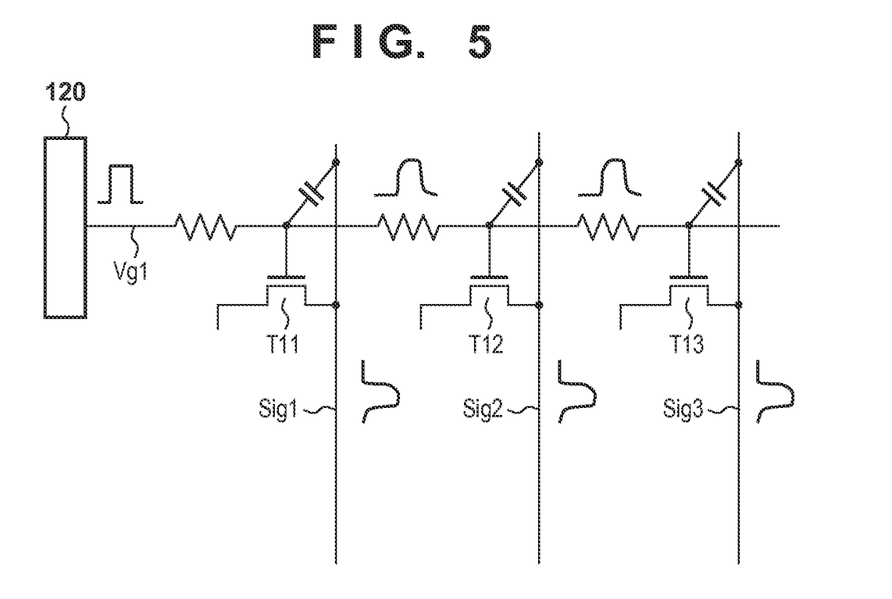
FIG. 5 is a diagram illustrating a change of a control signal that flows through driving lines in FIG. 1.

FIG. 5 is a block diagram that focuses on the driving line Vg1 and the signal lines Sig1 to Sig3 in the radiation imaging apparatus 100. High-frequency components of a pulsed control signal supplied from the driving circuit 120 to the driving line Vg1 are removed due to the influence of the low pass filter formed by wiring resistance of the driving line Vg1 and parasitic capacitance between the driving line Vg1 and the signal lines Sig1 to Sig3. The control signal flowing through the driving line Vg1 is transferred to the signal lines Sig1 to Sig3 via the parasitic capacitance between the driving line Vg1 and the signal lines Sig1 to Sig3. This transferred signal affects the integral amplifier IA. Therefore, the time period T1 is determined so as to be longer than the time taken until the signal flowing through the driving line Vg1 sufficiently responds and stabilizes.

For example, assuming that the wiring resistance of the driving line Vg1 is Rvg, and the capacitance value of the parasitic capacitance between the driving line Vg1 and the signal line Sig1 is Cvg, the time period T1 may be determined so as to satisfy T1>Rvg×Cvg×2. The wiring resistance of the driving line Vg1 may be a resistance value of a portion of the driving line Vg1 from the driving circuit 120 to an intersecting portion between the driving line Vg1 and the signal line Sig1. When T1=Rvg×Cvg×5, after a lapse of the time period T1, the output of the integral amplifier IA is about 0.7% of that at the time point when the thin-film transistor T11 is turned on.

In the case of setting the time period T1 to be short, the second sample-and-hold circuit SH2 ends the sampling in a state where the response is insufficient, and uncompleted response appears as an offset in a pixel signal. Therefore, the time period T1 may be shortened to the extent that this offset does not narrow the dynamic range of the radiation imaging apparatus 100 and affect the performance thereof. The offset to be generated depends on the wave height of the signals flowing through the driving lines Vg1 to Vg3 when the thin-film transistors T11 to T33 are turned on, and the parasitic capacitance between the driving lines Vg1 to Vg3 and the signal lines Sig1 to Sig3. Furthermore, the offset depends on the capacitance value of the capacitor Cf and the number of lines of the driving lines Vg1 to Vg3 through which the control signals at a high level simultaneously flow. Therefore, the time period T1 may be determined while considering these values.

The shortening of the sampling time by changing the time constant of the low pass filter LPF is more effective as the gain of the integral amplifier IA is higher. This is because, in general, when the gain of the integral amplifier IA is high, the image readout period in radioscopic imaging or the like is relatively short in many cases, and in addition, if the gain of the integral amplifier IA is high, a change of the output due to the turning on and off of the thin-film transistors T11 to T33 becomes large. For this reason, the absolute amount of the offset becomes large when the sampling is performed with insufficient response.

Figure 6:
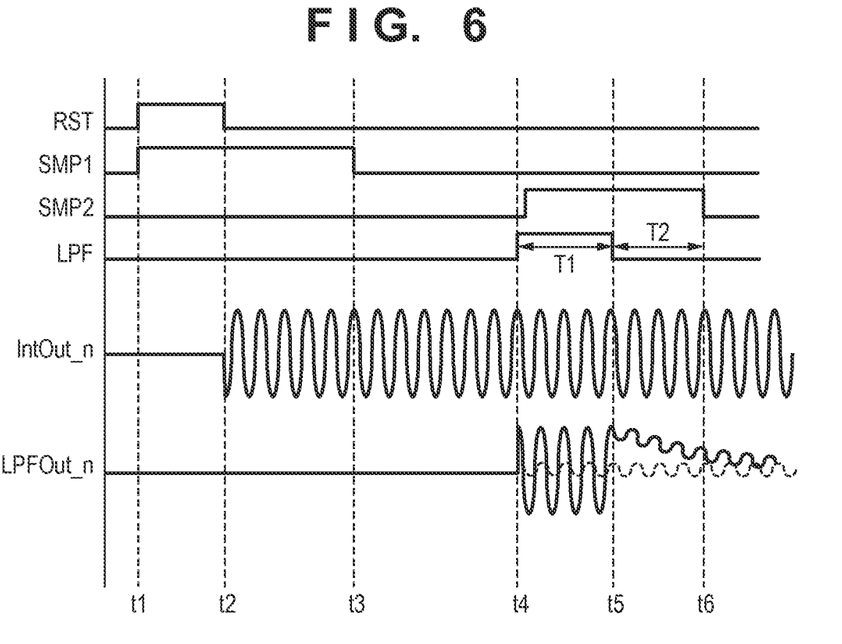
FIG. 6 is a timing chart illustrating noise generated in the column amplifier in FIG. 2.

The control circuit 140 increases the time constant of the low pass filter LPF in the middle of the sampling by the second sample-and-hold circuit SH2. Specifically, the control circuit 140 increases the time constant of the low pass filter LPF in accordance with a lapse of a predetermined time period (T1 in FIG. 4) from when the transfer period ends. Noise included in the pixel signal can thereby be reduced. The principle thereof will be described with reference to FIG. 6. FIG. 6 is a diagram that focuses on a part of the timing chart in FIG. 4. In FIG. 6, IntOut_n represents noise output from the integral amplifier IA, and LPFOut_n represents a signal appearing in the capacitor Ch2 due to the influence of the noise of the integral amplifier IA.

After the reset ends at the time t2, the integral amplifier IA outputs noise on various frequencies. The source of this noise includes thermal noise of the signal lines Sig1 to Sig3, noise of a circuit element of the integral amplifier IA, and the like. In FIG. 6, for the purpose of simplification of the description, it is presumed that the integral amplifier IA outputs noise on a fixed frequency. Upon the control circuit 140 decreasing the time constant of the low pass filter LPF at the time t4, the same noise as the noise output from the integral amplifier IA is then observed in the output of the low pass filter LPF, as shown by a solid line in FIG. 6. Assume that the timing (time t5) of increasing the time constant of the low pass filter LPF overlaps the peak of the noise observed in the output of the low pass filter LPF, as shown in FIG. 6. In this case, from the time t5 onward, a response is generated in which the noise attenuates due to the low pass filter LPF, starting from the peak of the noise. Therefore, the time period T2 (i.e., t6-t5) from when the time constant of the low pass filter LPF is increased until the sampling by the second sample-and-hold circuit SH2 ends is set such that this noise sufficiently decreases.

In the case of not decreasing the time constant of the low pass filter LPF (i.e., in the case where the switch SWf is constantly in an off state), the noise observed in the capacitor Ch2 is as shown by the broken line in FIG. 6. For this reason, if the time period T2 is short, the sampling is performed with insufficient response, and the noise increases.

The time period T2 may be determined by the amount of noise and the time constant (aforementioned τ2) of the low pass filter LPF from the time t5 onward. For example, a value with which the performance of the radiation imaging apparatus 100 is not affected may be experimentally determined by variously changing the time period T2 and measuring the amount of increase of the noise. Alternatively, the time period T2 may be qualitatively determined as described below.

Assume that noise from the pixel is $N_s$, noise in the integral amplifier IA and the signal line Sig1 measured with the switch SWf in an off state is $N_{amp1}$, and noise in the integral amplifier IA and the signal line Sig1 measured with the switch SWf in an on state is $N_{amp2}$. Also assume that noise in a circuit downstream of the second sample-and-hold circuit SH2 is $N_{ADC}$. In this case, it is considered that the increase of the noise is caused due to $N_{amp2}$ being output as-is. For this reason, the total amount of noise $N_{all}$ in the system is given by the following equation.

$$N_{all}^2 = N_s^2 + N_{amp1}^2 + N_{amp2}^2 \times G^2 + N_{ADC}^2$$

Here, G is the attenuation amount of noise from the time t5 onward, and it can be represented that G=exp(−n) (where n is a natural number).

For example, when the total noise in the case of changing the time constant of the low pass filter LPF as described above is larger, only by 1%, than the total noise in the case of not changing the time constant, the following relationship holds.

$$1.01^2 = (N_s^2 + N_{amp1}^2 + N_{amp2}^2 \times G^2 + N_{ADC}^2)/(N_s^2 + N_{amp1}^2 + N_{ADC}^2)$$

This equation can be transformed into $$G^2 = (N_s^2 + N_{amp1}^2 + N_{ADC}^2) \times 0.0201/N_{amp2}^2.$$

$(N_s^2 + N_{amp1}^2 + N_{ADC}^2)$ can be acquired by measuring the noise in a state where the switch SWf is kept in an off state.

$N_{amp2}^2$ can be calculated from the noise in a state where the switch SWf is kept in an off state and the noise in a state where the switch SWf is kept in an on state.

For example, assuming that $N_s$=100, $N_{amp1}$=200, $N_{amp2}$=220, and $N_{ADC}$=50, G=0.148. Accordingly, n=1.9. Then, a target amount of noise can be achieved by setting, as T2, the time period that is 1.9 times the time constant τ2. For example, if τ2=10 μs, the time period T2 is set to 19 μs. In general, the time period T2 may be set such that T2<3×τ2.

Figure 7:
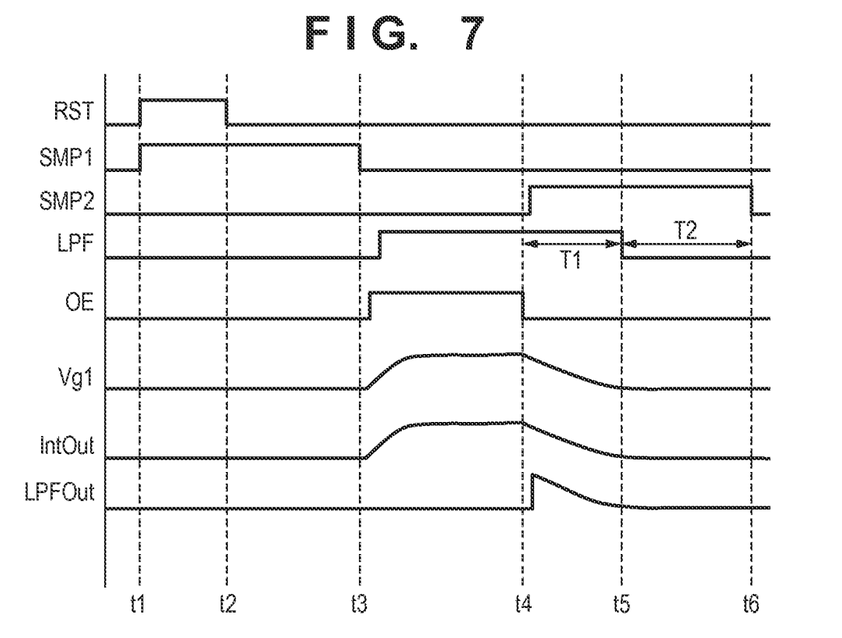
FIG. 7 is a timing chart illustrating another exemplary operation of the radiation imaging apparatus in FIG. 1.
Figure 8:
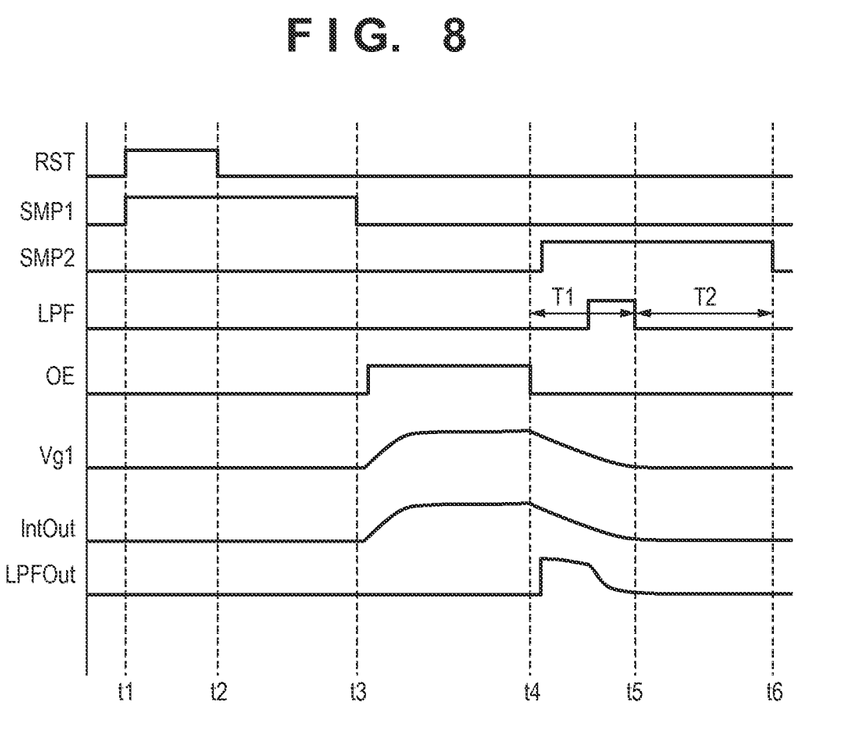
FIG. 8 is a timing chart illustrating another exemplary operation of the radiation imaging apparatus in FIG. 1.

Subsequently, other exemplary operations of the radiation imaging apparatus 100 will be described with reference to the timing charts in FIGS. 7 and 8. The operations in FIGS. 7 and 8 are different from the operation in FIG. 4 in the timing of changing the time constant of the low pass filter LPF, and other points may be similar. In the operation in FIG. 7, after the sampling by the first sample-and-hold circuit SH1 ends, the control circuit 140 decreases the time constant of the low pass filter LPF during the charge transfer period. In the operation in FIG. 8, after the sampling by the first sample-and-hold circuit SH1 ends, the control circuit 140 decreases the time constant of the low pass filter LPF in the middle of the sampling by the second sample-and-hold circuit SH2. In either case, the time taken for the sampling by the second sample-and-hold circuit SH2 can be shortened.

Furthermore, in either of the above-described operations, the rise of the control signal RST at the time t1 does not have to be simultaneous with the rise of the control signal SMP1, and the switch SWs1 may be turned on in a state where the switch SWr is in an on state. Also, the switch SWs2 may be turned on in a state where the switch SWr is in an on state.

Figure 9:
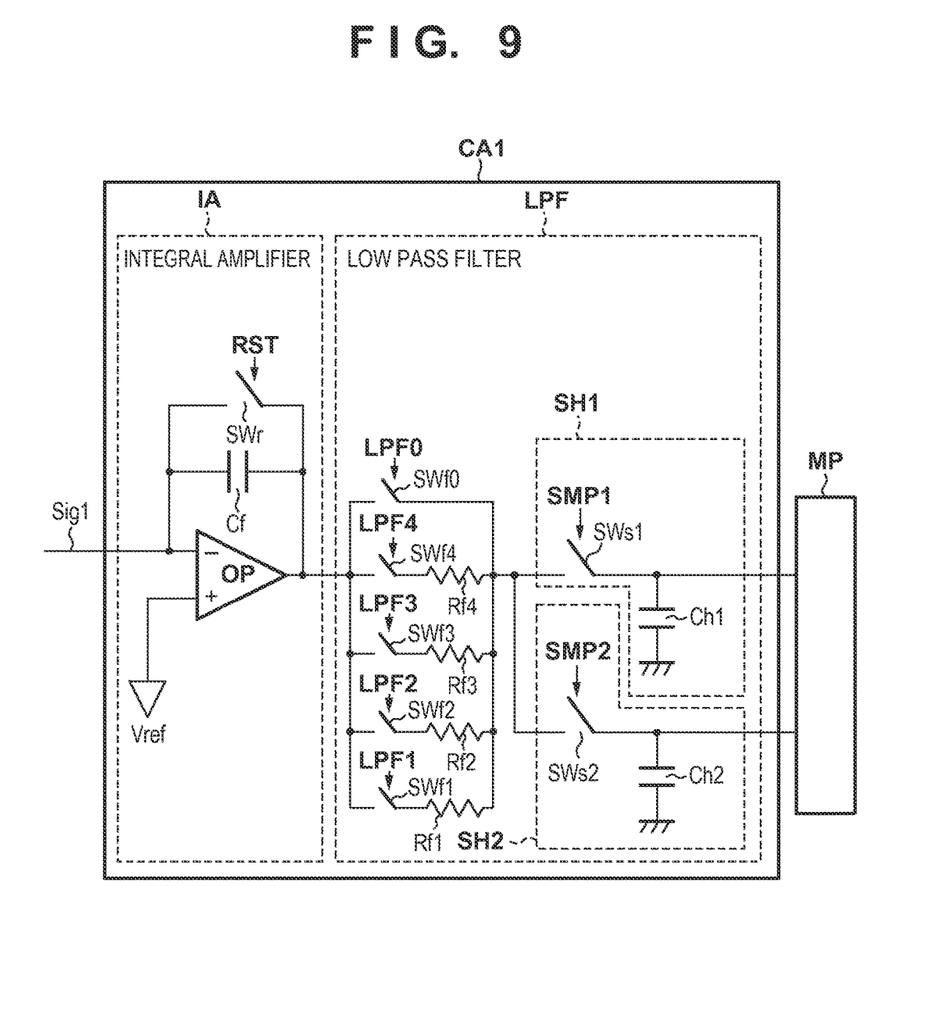
FIG. 9 is an equivalent circuit diagram illustrating another exemplary configuration of the column amplifier in the radiation imaging apparatus in FIG. 1.

Subsequently, another exemplary configuration of the column amplifier CA1 will be described with reference FIG. 9. FIG. 9 is different from the example in FIG. 2 in that the low pass filter LPF is provided with a plurality of resistors Rf1 to Rf4 and a plurality of switches SWf1 to SWf4 connected to the respective resistors, and other points may be similar. The number of resistors included in the low pass filter LPF is not limited to four. The control circuit 140 can change the time constant of the low pass filter LPF in three or more steps by changing the switch that is to be turned on among the switches SWf0 to SWf4. For example, the control circuit 140 may switch the value of the time constant of the low pass filter LPF at each time point in accordance with imaging conditions such as the operation speed of the pixel array 110.

Figure 10:
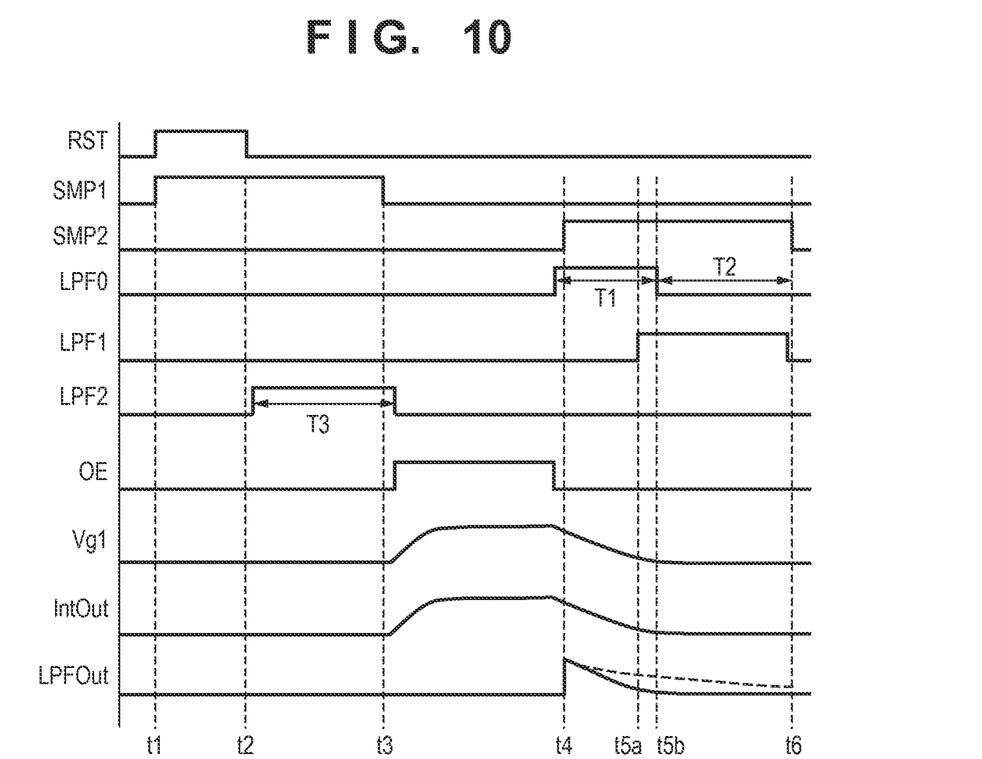
FIG. 10 is a timing chart illustrating another exemplary operation of the radiation imaging apparatus in FIG. 1.

Subsequently, an exemplary operation of the radiation imaging apparatus 100 using the column amplifier CA1 in FIG. 9 will be described with reference to the timing chart in FIG. 10. In this exemplary operation, the control signals to the switches SWf3 and SWf4 are constantly at a low level (i.e., these switches are not used), and accordingly the waveforms thereof will be omitted.

Upon the reset of the integral amplifier IA ending at the time t2, the control circuit 140 turns on the switch SWf2 and changes the time constant of the low pass filter LPF in the middle of the sampling by the first sample-and-hold circuit SH1. The time constant of the low pass filter LPF in a state where the switches SWf0 and SWf1 are in an off state and the switch SWf2 is in an on state is denoted as τ3. Upon the sampling by the first sample-and-hold circuit SH1 ending at the time t3, the control circuit 140 turns off the switch SWf2 and restores the time constant. The length of the time period during which the time constant of the low pass filter LPF is τ3 is denoted as T3. The time constant of the low pass filter LPF at the time when the sampling by the first sample-and-hold circuit SH1 ends is τ3.

Subsequently, the control circuit 140 turns on the switch SWf0 and decreases the time constant of the low pass filter LPF simultaneously with the end of the charge transfer period at the time t4. Assume that the time constant after being decreased is τ1, as in the above-described example. Thereafter, the control circuit 140 turns on the switch SWf1 at the time t5a to increase the time constant of the low pass filter LPF, and turns off the switch SWf0 at the time t5b to further increase the time constant of the low pass filter LPF. The time constant of the low pass filter LPF in a state where the switches SWf0 and SWf2 are in an off state and the switch SWf1 is in an on state is denoted by T2. When the time constant is T1, the integral amplifier IA and the sample-and-hold circuits SH1 and SH2 are shorted, and accordingly τ1<τ2 and τ1≤τ3 are satisfied.

The noise generated after the reset of the integral amplifier IA is completed includes kTC noise generated when the integral amplifier IA is reset, noise of the integral amplifier IA itself, and wiring noise of the signal line output via the integral amplifier IA. The kTC noise is white noise whose amount does not change depending on the frequency. The noise of the integral amplifier IA itself and the wiring noise of the signal line output via the integral amplifier IA depend on the frequency characteristic of the integral amplifier IA, and the amount of noise tends to decrease as the frequency increases in most cases. Accordingly, in order to reduce noise, the time constant of the low pass filter LPF is set large during this period so as to effectively remove the ktC noise.

On the other hand, the noise generated at the time of the sampling by the second sample-and-hold circuit SH2 is the noise of the integral amplifier IA itself and the wiring noise of the signal line output via the integral amplifier IA. Accordingly, the time constant of the low pass filter LPF does not need to be set larger than the frequency characteristic of the integral amplifier IA, and τ2 is determined to be the value obtained during this time period. As a result, τ2≠τ3 may hold. For example, τ2<τ3 may hold. Thus, the readout speed can be increased while further reducing noise by separately determining τ2 and τ3. Furthermore, the time period T3 can be set separately from the time period T1 and the time period T2, and for example, T3≠T1+T2 may hold.

Figure 11:
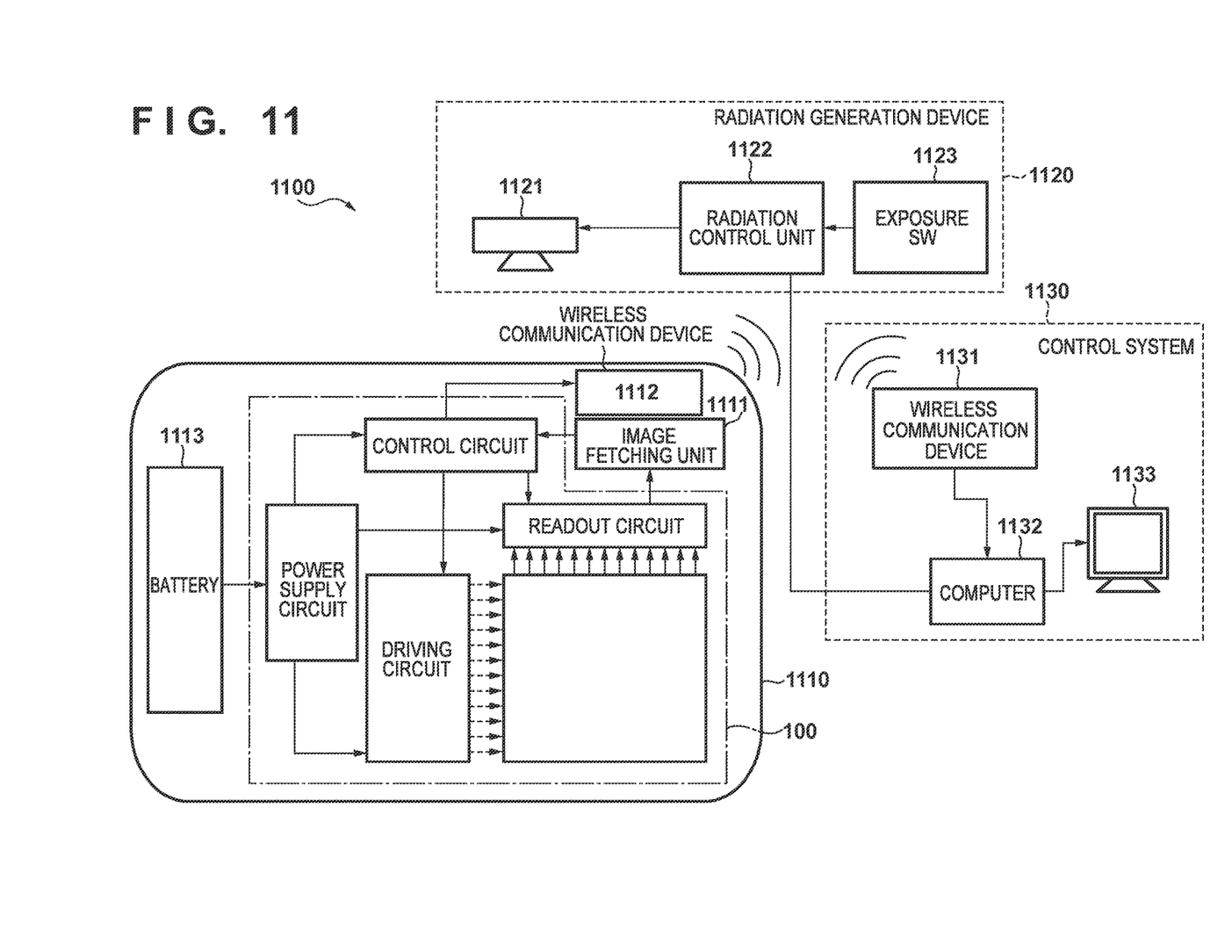
FIG. 11 is a block diagram illustrating a configuration of a radiation imaging system according to some embodiments.

Subsequently, an exemplary configuration of a radiation imaging system 1100 according to some embodiments will now be described with reference to the block diagram in FIG. 11. The radiation imaging system 1100 includes an imaging unit 1110, a radiation generation device 1120, and a control system 1130. The radiation generation device 1120 includes a radiation tube bulb 1121, a radiation control unit 1122 that controls the radiation tube bulb 1121, and an exposure switch 1123 that switches radiation exposure between an on state and an off state. Upon the exposure switch 1123 being pressed, the radiation control unit 1122 causes the radiation tube bulb 1121 to perform radiation exposure under a predetermined condition.

The imaging unit 1110 includes the above-described radiation imaging apparatus 100, an image fetching unit 1111, a wireless communication device 1112, and a battery 1113. The image fetching unit 1111 fetches an image signal from the radiation imaging apparatus 100 and performs necessary processing. The wireless communication device 1112 wirelessly communicates with an external device, such as the control system 1130. The battery 1113 supplies electricity to the radiation imaging apparatus 100. When the radiation imaging system 1100 is used for diagnostic imaging, the number of pixels in the pixel array 110 is 2000×2000 pixels or larger in some cases. In such a case of a large number of pixels, the radiation imaging apparatus 100 may be provided with a plurality of readout circuits 130 and read out a pixel signal from each of groups of the signal lines Sig1 to Sig3. The size of the imaging unit 1110 may be a size similar to that of a film cassette, and a conventional device can be incorporated without conversion. The weight of the imaging unit 1110 may be about 3 kg so as to be portable, and it is easy to carry it into a ward or the like.

The control system 1130 includes a wireless communication device 1131 that communicates with the imaging unit 1110, a computer 1132, and a display 1133. The computer 1132 has a function of controlling operations of the imaging unit 1110, a function of transmitting and receiving information related to imaging to and from a network in a hospital, a function of controlling the screen of the display 1133, and a function of performing signal processing on the image signal acquired from the imaging unit 1110. These functions may be realized on software, or may be physically realized by using a dedicated IC or a programmable IC.

With the above-described configuration, upon radiation exposure being performed, the radiation that has been transmitted through an object reaches the imaging unit 1110, the imaging unit 1110 detects a change of bias current, and the pixel array 110 is caused to perform the storage operation so as to convert the radiation that has been transmitted through the object into an electric signal and store it. Furthermore, after the imaging unit 1110 detects completion of the radiation exposure, the image fetching unit 1111 fetches a digitalized radiation image signal from the radiation imaging apparatus 100, and transmits it to the control system 1130. The control system 1130 performs appropriate image processing with the computer 1132, and thereafter displays a radiographic image on the display 1133. The relationship between the imaging unit 1110 and the control system 1130 may be one-to-one, one-to-many, many-to-one, or many-to-many.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-073725, filed Mar. 31, 2014, which is hereby incorporated by reference herein in its entirety.

What is claimed is:

1. An imaging apparatus comprising:
a pixel that generates charge;
an integral amplifier that integrates charge transferred from the pixel;
a low pass filter to which output of the integral amplifier is supplied and whose time constant is variable;
a first sample-and-hold circuit that samples and holds output of the low pass filter before the charge is transferred from the pixel to the integral amplifier;
a second sample-and-hold circuit that samples and holds output of the low pass filter after the charge is transferred from the pixel to the integral amplifier;
a differential circuit that outputs a difference between a signal held by the first sample-and-hold circuit and a signal held by the second sample-and-hold circuit; and
a control circuit that changes the time constant of the low pass filter,
wherein the control circuit decreases the time constant of the low pass filter after the sampling by the first sample-and-hold circuit ends, and increases the time constant of the low pass filter in the middle of the sampling by the second sample-and-hold circuit.

2. The imaging apparatus according to claim 1,
wherein the control circuit increases the time constant of the low pass filter in accordance with a lapse of a predetermined time period from when a transfer period for transferring charge from the pixel to the integral amplifier ends.

3. The imaging apparatus according to claim 1,
wherein the control circuit decreases the time constant of the low pass filter, before the second sample-and-hold circuit starts the sampling.

4. The imaging apparatus according to claim 1,
wherein, assuming that the time constant of the low pass filter before the control circuit increases the time constant in the middle of the sampling by the second sample-and-hold circuit is $\tau 1$,
the time constant of the low pass filter after the control circuit increases the time constant in the middle of the sampling by the second sample-and-hold circuit is $\tau 2$, and
the time constant of the low pass filter at the time of an end of the sampling by the first sample-and-hold circuit is $\tau 3$,
$\tau 1 < \tau 2$ and $\tau 1 \leq \tau 3$ are satisfied.

5. The imaging apparatus according to claim 4,
wherein, assuming that the time period from when the control circuit increases the time constant of the low pass filter until the sampling by the second sample-and-hold circuit ends is T2,
$T2 < 3 \times \tau 2$ is satisfied.

6. The imaging apparatus according to claim 4,
wherein $\tau 2 \neq \tau 3$ is satisfied.

7. The imaging apparatus according to claim 4,
wherein $\tau 2 < \tau 3$ is satisfied.

8. The imaging apparatus according to claim 4,
wherein the control circuit switches at least one of values of $\tau 1$, $\tau 2$, and $\tau 3$ in accordance with an imaging condition.

9. The imaging apparatus according to claim 1,
wherein the pixel includes:
a conversion element that converts an electromagnetic wave into charge; and
a transfer switch that transfers the converted charge to the integral amplifier through a signal line in accordance with a control signal supplied through a driving line.

10. The imaging apparatus according to claim 9,
wherein the transfer switch is constituted by a thin-film transistor.

11. The imaging apparatus according to claim 9,
wherein, assuming that the time period from when a transfer period for transferring charge from the pixel to the integral amplifier ends until the control circuit increases the time constant of the low pass filter is T1,
wiring resistance of the driving line is Rvg, and
parasitic capacitance between the driving line and the signal line is Cvg,
$T1 > Rvg \times Cvg \times 2$ is satisfied.

12. The imaging apparatus according to claim 1,
further comprising a switch that resets charge stored in the integral amplifier,
wherein the control circuit resets the charge stored in the integral amplifier, before the charge is transferred from the pixel to the integral amplifier.

13. The imaging apparatus according to claim 1,
wherein the pixel generates the charge in accordance with radiation that has entered the imaging apparatus.

14. An imaging system comprising:
the imaging apparatus according to claim 1; and
a signal processing unit for processing a signal obtained by the imaging apparatus.

* * * * *